(12) United States Patent
Emericks et al.

(10) Patent No.: US 6,195,429 B1
(45) Date of Patent: Feb. 27, 2001

(54) ARRANGEMENT IN A SUBSCRIBER LINE INTERFACE CIRCUIT

(75) Inventors: Anders Emericks; Henrik Hellberg, both of Solna; Mattias Israelsson; Carl-Henrik Malmgren, both of Stockholm, all of (SE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 09/053,727

(22) Filed: Apr. 2, 1998

(30) Foreign Application Priority Data

Apr. 23, 1997 (SE) .................................................. 9701524

(51) Int. Cl.[7] .............................. H04M 1/24; H03K 7/06
(52) U.S. Cl. .......................................... 379/400; 332/112
(58) Field of Search ..................................... 379/399, 400, 379/401, 402, 403, 413; 332/108, 109, 112

(56) References Cited

U.S. PATENT DOCUMENTS

| | | | |
|---|---|---|---|
| 3,582,784 | * 6/1971 | Gaunt, Jr. ............................ | 332/108 |
| 4,380,746 | * 4/1983 | Sun et al. ............................ | 332/108 |
| 4,399,440 | 8/1983 | Douglas . | |
| 4,435,622 | 3/1984 | Grantland et al. . | |
| 4,479,174 | * 10/1984 | Cates .................................. | 363/21 |
| 4,794,333 | * 12/1988 | Milkovic ............................ | 324/142 |
| 4,800,333 | * 1/1989 | Milkovic ............................ | 324/142 |
| 4,853,959 | * 8/1989 | Johansson .......................... | 379/399 |
| 5,287,404 | 2/1994 | Pepper et al. . | |
| 5,329,588 | * 7/1994 | Willocx et al. ..................... | 379/399 |
| 5,734,205 | * 3/1998 | Okamura et al. .................. | 307/110 |
| 5,864,219 | * 1/1999 | Fink ................................... | 320/132 |

* cited by examiner

*Primary Examiner*—David R. Hudspeth
*Assistant Examiner*—Martin Lerner
(74) *Attorney, Agent, or Firm*—Nixon & Vanderhye P.C.

(57) ABSTRACT

In a subscriber line interface circuit connected to a telephone line having a high potential wire and a low potential wire, an arrangement for generating a signal for determining the line voltage comprises means (7, 10, 11) for alternately charging a capacitor (6), by means of a first DC current, to a first voltage, and discharging the capacitor (6), by means of a second DC current, to a second voltage. Hereby, a sawtooth wave having an amplitude corresponding to the difference between the first and second voltages is produced. This sawtooth wave is converted to a pulse train related to the line voltage, from which the line voltage can be determined.

9 Claims, 3 Drawing Sheets

ARRANGEMENT IN A SUBSCRIBER LINE INTERFACE CIRCUIT

TECHNICAL FIELD

The invention relates generally to subscriber line interface circuits and, more specifically, to an arrangement for determining the line voltage in a subscriber line interface circuit.

BACKGROUND OF THE INVENTION

To be able to adjust hybrid interface parameters and gain in a telephone circuit by means of a microprocessor on a line interface board in order to obtain good echo cancellation for telephone lines of different lengths as well as for certain test purposes, it is necessary to know the length of the respective telephone line.

One way of estimating the length of the line is to measure the line voltage. i.e. the voltage that appears across the line and the telephone set when a connection is established.

It is known to generate a pulse having a length corresponding to the line voltage. To get information about the line voltage, the length of this pulse is then measured by the microprocessor on the line interface board.

When a pulse length is to be measured, it is difficult to get at good resolution since the measurement period will be determined by the pulse length. The instruction cycle of the microprocessor has to be short relative to the shortest pulse length of interest and, moreover, the microprocessor cannot do anything else during that time.

SUMMARY OF THE INVENTION

The object of the invention is to bring about an arrangement in a subscriber line interface circuit for generating a signal for determining the line voltage without occupying the microprocessor unnecessarily.

This is attained by means of the arrangement in accordance with the invention in that a sawtooth wave having an amplitude corresponding to the difference between a first and a second voltage, e.g. the voltages of the A-wire and the B-wire, respectively, is generated and, in its turn, converted to a pulse train related to the line voltage.

In accordance with the invention, the pulse train is related to the line voltage by its pulse repetiton frequency and/or by its mark-space ratio. Depending upon the actual application, these different relationships offer different advantages. Generally, by generating a continuous pulse train and measuring its pulse repetition frequency and/or its mark-space ratio, it will be possible to freely choose the measurement period. Thus, a greater flexibility is obtained in accordance with the invention.

BRIEF DESCRIPTION OF THE DRAWING

The invention will be described more in detail below with reference to the appended drawing, on which FIG. 1 schematically illustrates a first embodiment of an arrangement according to the invention.

PREFERRED EMBODIMENTS

Figure 1:
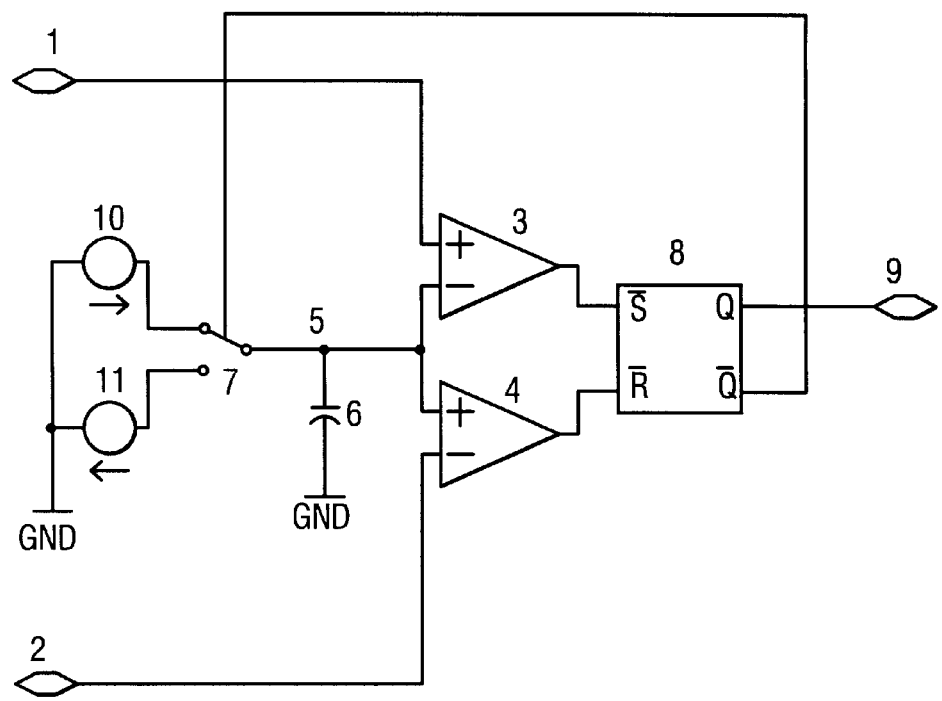
FIGS. 1A and 1B illustrate signals appearing in the embodiment according to FIG. 1, FIG. 2 schematically illustrates a second embodiment of an arrangement according to the invention, based on the arrangement illustrated in FIG. 1, FIGS. 2A, 2B, 2C and 2D illustrate signals appearing in the embodiment illustrated in FIG. 2, FIG. 3 schematically illustrates a third embodiment of an arrangement according to the invention.

FIG. 1 illustrates a first embodiment of an arrangement according to the invention for generating a signal for determining the line voltage in a subscriber line interface circuit connected to a telephone line having a high potential wire and a low potential wire.

In the arrangement in FIG. 1, the high potential wire or A-wire (not shown) is connected to a terminal 1, while the low potential wire or B-wire is connected to a terminal 2.

The terminal 1 is connected to the (+)-input terminal of a comparator 3, while the terminal 2 is connected to the (−)-input terminal of a comparator 4. The (−)-input terminal of the comparator 3 and the (+)-input terminal of the comparator 4 are interconnected and the interconnection point is connected to a node 5. A capacitor 6 is interconnected between the node 5 and ground GND.

The switching element of a voltage-controlled switch 7 is connected to the node 5 and controlled to switch between its upper and lower position by means of a signal from the output terminal $\overline{Q}$ of a bistable circuit 8 whose output terminal Q constitutes the output terminal 9 of the arrangement shown in FIG. 1. The output terminal 9 may be connected to a microprocessor (not shown), common to a plurality of subscriber line interface circuits.

The inverted set input terminal $\overline{S}$ of the bistable circuit 8 is connected to the output terminal of the comparator 3, while the inverted reset input terminal $\overline{R}$ of the bistable circuit 8 is connected to the output terminal of the comparator 4.

In its upper position, as illustrated in FIG. 1, the switching element of the switch 7 connects a first current generator 10 to the node 5 for charging the capacitor 6 as indicated by an arrow, while in its lower position, the switching element of the switch 7 connects a second current generator 11 to the node 5 for discharging the capacitor 6 as indicated by an arrow. The current generators 10 and 11 are interconnected between ground GND and the upper and lower terminals, respectively, of the switch 7. The current generators 10 and 11 may generate currents of identical or different values.

The operation of the embodiment illustrated in FIG. 1 will now be described.

Suppose that the voltage across the capacitor 6, i.e. in the node 5, is of a value between the voltage V1 on the A-wire connected to the terminal 1 and the voltage V2 on the B-wire connected to the terminal 2.

Under this condition, the output signal from the comparator 3 as well as from the comparator 4 will be a logic "1". These signals will not affect the bistable circuit 8. The bistable circuit 8 is supposed to have a logic "1" on its output terminal Q and a logic "0" on its inverting output $\overline{Q}$. The switching element of the switch 7 will then be in its lower position (not shown) in which the current from the current generator 11 will discharge the capacitor 7 at a constant rate.

When the voltage across the capacitor 6, i.e. the voltage in the node 5, goes below the voltage on the B-wire connected to the terminal 2, the output signal from the comparator 4 will switch to a logic "0" which will reset the bistable circuit 8. Then, the output Q will go low,while the output $\overline{Q}$ goes high. This causes the switching element of the switch 7 to switch to its upper position, connecting the current generator 10 to the node 5.

Now, the capacitor 6 will be charged at a constant rate until its voltage exceeds the voltage on the A-wire connected to the terminal 1. Then the comparator 3 will switch its output signal, setting the bistable circuit 8 which again via the switch 7 connects the current generator 11 to the node 5.

This operating cycle is repeated as long as the connection is kept active.

Figure 1A:
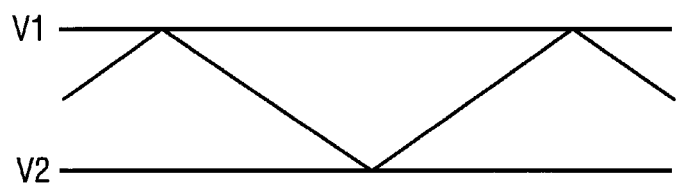
Figure 1B:
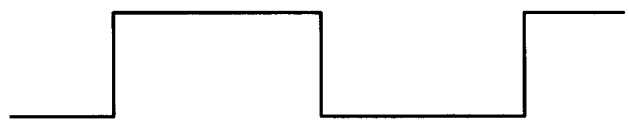

Consequently, the voltage in the node 5 will be a sawtooth wave as illustrated in FIG. 1A, while the output signal on the output terminal 9 will be a square-wave pulse train as illustrated in FIG. 1B.

The amplitude of the sawtooth wave shown in FIG. 1A will be equal to the line voltage, i.e. the voltage V1–V2 between the input terminals 1 and 2.

The capacitance of the capacitor 6 as well as the values of the constant currents supplied by the current generators 10 and 11, are known. Since the capacitor 6 is charged and discharged, respectively, by these constant currents between voltages depending on the line voltage, the line voltage can easily be determined from the pulse repetition frequency of the pulse train in FIG. 1B by means of the microprocessor connected to the output terminal 9. The pulse repetition frequency of the pulse train on the terminal 9, as illustrated in FIG. 1B, will be inversely proportional to the line voltage.

A monostable circuit (not shown) may be connected to the output terminal 9 to convert the pulses of the pulse train to pulses of equal width.

The advantage of such an embodiment is that it will be possible to extract line length information in two different ways:

On the one hand, as before, the pulse repetition frequency will be inversely proportional to the line voltage.

On the other hand, the mean value of the output voltage will be inversely proportional to the line voltage. The mean value is easily extracted by lowpass filtering.

Thus, such an embodiment gives an output signal that can be read directly by the microprocessor as a frequency or by an analog-to-digital converter.

The operation of a second embodiment of the arrangement according to the invention will now be described with reference to FIG. 2.

The embodiment according to FIG. 2 resembles to some extent the embodiment as shown in FIG. 1 as will be apparent from the below description.

Figure 2:
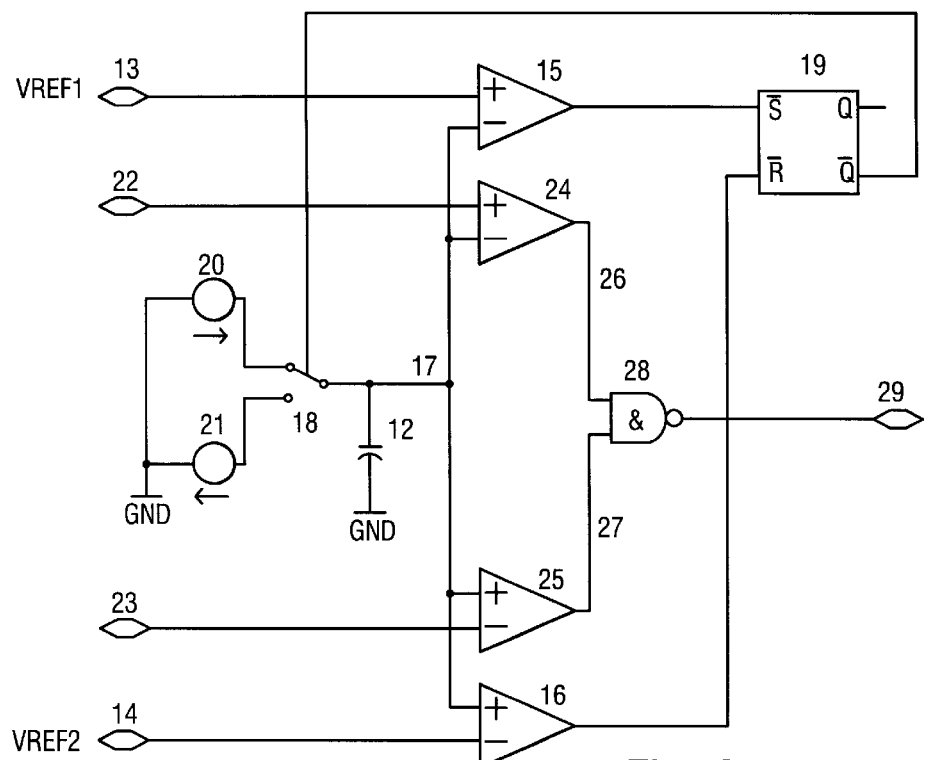

In the embodiment according to FIG. 2, a capacitor 12 corresponding to the capacitor 6 in FIG. 1, is charged and discharged between a first reference voltage VREF1 applied to an input terminal 13, and a second reference voltage VREF2 applied to a input terminal 14. The terminal 13 is connected to the (+)-input terminal of a comparator 15, while the terminal 14 is connected to the (−)-input terminal of a comparator 16 corresponding to the comparators 3 and 4, respectively, in FIG. 1.

The (−)-input terminal of the comparator 15 and the (+)-input terminal of the comparator 16 are interconnected and the interconnection point is connected to a node 17. The capacitor 12 is interconnected between the node 17 and ground GND.

The node 17 is also connected to the switching element of a voltage-controlled switch 18 which as in the embodiment in FIG. 1, is controlled between its upper and lower position from the output terminal $\overline{Q}$ of a bistable circuit 19. In this embodiment, the output terminal Q of the bistable circuit 19 is not used.

In the same manner as in the embodiment in FIG. 1, the input terminals $\overline{S}$ and $\overline{R}$ of the bistable circuit 19 are connected to the output terminals of the comparators 15 and 16, respectively.

In its upper position, the switching element of the switch 18 connects a first current generator 20 to the node 17 for charging the capacitor 12 as indicated by an arrow, while in its lower position, the switching element of the switch 18 connects a second current generator 21 to the node 17 for discharging the capacitor 12 as indicated by an arrow.

Figure 2A:
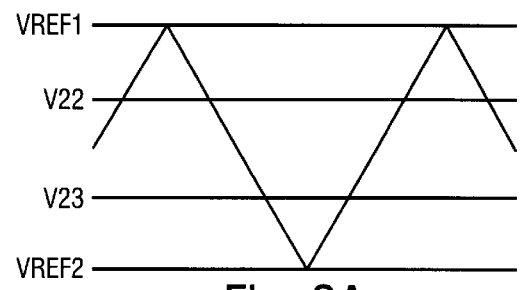

Thus, the capacitor 12 will be charged and discharged between the voltages VREF1 and VREF2, respectively, as illustrated in FIG. 2A where the upper line corresponds to the VREF1 and the lower line corresponds to the voltage VREF2 as indicated.

In the embodiment according to FIG. 2, the high potential wire, i.e. the A-wire, of the telephone line is supposed to be connected to a terminal 22, while the low potential wire, i.e. the B-wire, is supposed to be connected to a terminal 23.

The terminal 22 is connected to the (+)-input terminal of a comparator 24, while the terminal 23 is connected to the (−)-input terminal of a comparator 25. The (−)-input terminal of the comparator 24 and the (+)-input terminal of the comparator 25 are interconnected and the interconnection point is connected to the node 17.

The output terminal 26 of the comparator 24 and the output terminal 27 of the comparator 25 are connected to the respective input terminals of an NAND-circuit 28 whose output terminal constitutes the output terminal 29 of the embodiment in accordance with FIG. 2.

In FIG. 2A, the voltage on the A-wire connected to the terminal 22 is denoted V22, while the voltage on the B-wire connected to the terminal 23, is denoted V23.

Figure 2B:
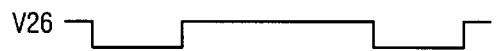

As apparent from FIG. 2B illustrating the output signal from the comparator 24, the output voltage V26 of the comparator 24 will be low when the voltage across the capacitor 12 exceeds the A-wire voltage V22, and high when the capacitor 12 voltage is below the A-wire voltage V22.

Figure 2C:

The output voltage V27 of the comparator 25 as illustrated in FIG. 2C will be high as long as the voltage across the capacitor 12 is above the B-wire voltage V23, and low as long as the voltage across the capacitor 12 is below the B-wire voltage V23.

Figure 2D:

Supplying the signals V26 and V27 to the input terminals of the NAND circuit 28 will result in an output signal from the NAND circuit 28 as illustrated in FIG. 2D.

This output signal, denoted V29, will appear on the output terminal 29 of the arrangement in FIG. 2.

As apparent, the pulse train appearing on the output terminal 29 will have a fixed pulse repetition frequency. This is due to the fact that the capacitor 12 is charged and discharged between two constant voltages VREF1 and VREF2 by means of constant currents. The mark-space ratio of the pulse train will be proportional to the ratio between the line voltage and the difference between the reference voltages VREF1 and VREF2 applied to the terminals 13 and 14, respectively.

The advantage of the embodiment according to FIG. 2 is that the mean value of the output pulse train voltage will be proportional to the line voltage if VREF1 and VREF2 are fixed. This mean value is easily extracted by means of lowpass filtering. In applications including an analog-to-digital converter, this embodiment may be preferable.

Thus, also in this second embodiment, a pulse train related to the line voltage will be generated.

Figure 3:
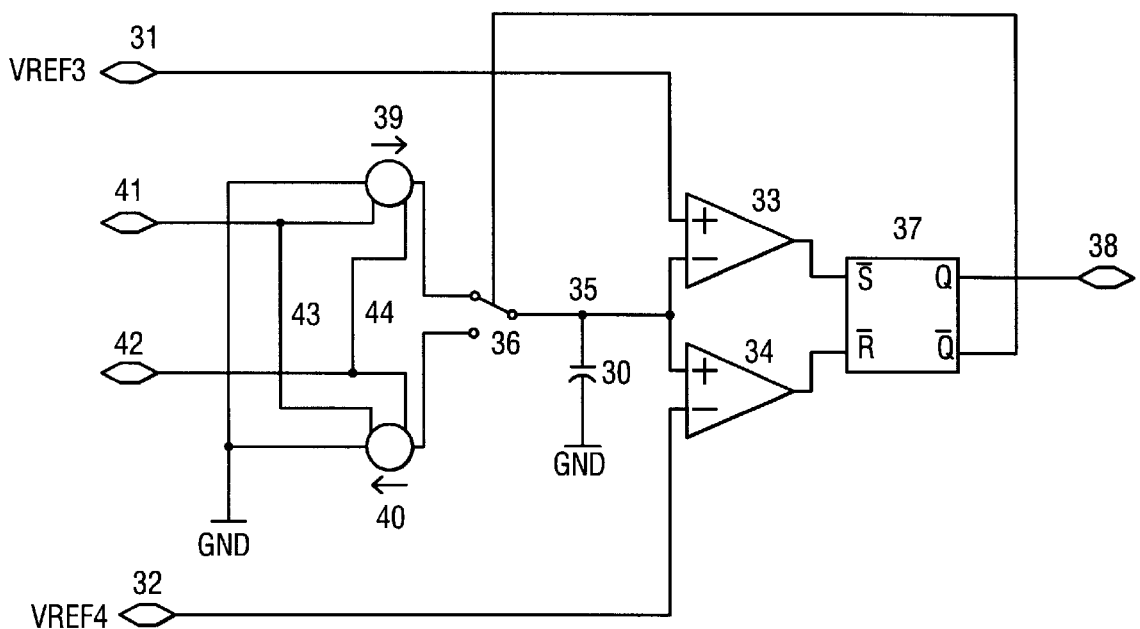
FIGS. 3A and 3B illustrate signals appearing in the embodiment according to FIG. 3.

FIG. 3 illustrates a third embodiment of the invention.

In the embodiment according to FIG. 3, a capacitor 30 is charged and discharged between reference voltages VREF3 and VREF4. The reference voltage VREF3 is applied to an input terminal 31, while the reference voltage VREF4 is applied to an input terminal 32. The terminal 31 is connected to the (+)-input terminal of a comparator 33, while the terminal 32 is connected to the (−)-input terminal of a comparator 34.

The (−)-input terminal of the comparator 33 and the (+)-input terminal of the comparator 34 are interconnected and the interconnection point is connected to a node 35. The capacitor 30 is interconnected between the node 35 and ground GND.

The node 35 is also connected to the switching element of a voltage-controlled switch 36 which as in the embodiment in FIG. 1, is controlled between its upper and lower position from the output terminal $\overline{Q}$ of a bistable circuit 37 whose output terminal Q constitutes the output terminal 38 of the arrangement shown in FIG. 3.

In the same manner as in the embodiment in FIG. 1, the input terminals $\overline{S}$ and $\overline{R}$ of the bistable circuit 37 are connected to the output terminals of the comparators 33 and 34, respectively.

In its upper position, the switching element of the switch 36 connects a first current generator 39 to the node 36 for charging the capacitor 30 as indicated by an arrow, while in its lower position, the switching element of the switch 36 connects a second current generator 40 to the node 30 for discharging the capacitor 30 as indicated by an arrow.

In the embodiment according to FIG. 3, the high potential wire, i.e. the A-wire, of the telephone line is supposed to be connected to a terminal 41, while the low potential wire, i.e. the B-wire, is supposed to be connected to a terminal 42.

The terminals 41 and 42, i.e. the A-wire and the B-wire, are connected to control input terminals 43 and 44 of the current generators 39 and 40 to control these current generators to generate currents in response to the line voltage, i.e. the voltage between the terminals 41 and 42 or the A-wire and the B-wire.

Figure 3A:
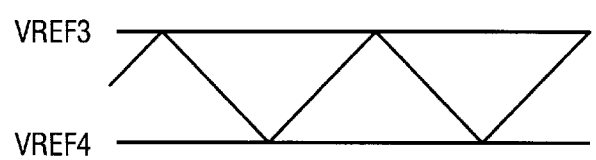

Thus, the capacitor 30 will be charged and discharged between the constant voltages VREF3 and VREF4, respectively, as illustrated in FIG. 3A, by means of currents that are proportional to the line voltage.

Figure 3B:

The resulting pulse train appearing on the output terminal 38, as illustrated in FIG. 3B, win have a pulse repetition frequency which is proportional to the line voltage.

As above, a monostable circuit may be connected to the output terminal 38 to convert the pulses of the pulse train to pulses of equal width. Thus, the output signal will contain information about the line voltage both in its pulse repetition frequency and its mean value.

What is claimed is:

1. In a subscriber line interface circuit connected to a telephone line having a high potential wire and a low potential wire, an arrangement for generating a signal for determining the line voltage comprising:

means, including respective first and second current generators that are separate from said high and low potential telephone line wires, for alternately (1) charging a capacitor by means of a first DC current from said first current generator to a first voltage, and (2) discharging the capacitor by means of a second DC current from said second current generator to a second voltage to produce a sawtooth wave having an amplitude corresponding to the difference between the first and second voltages, and means for converting the sawtooth wave to a pulse train related to the line voltage.

2. The arrangement according to claim 1, wherein:

the first voltage corresponds to the potential (V1) of the high potential wire, the second voltage corresponds to the potential (V2) of the low potential wire, and said means for converting the sawtooth wave is adapted to convert the sawtooth wave to a pulse train having a pulse repetition frequency which is inversely proportional to the line voltage.

3. The arrangement as claimed in claim 2, characterized in that it comprises means for converting the pulses of the pulse train to pulses of equal width.

4. The arrangement according to claim 1, wherein:

said means for alternately charging are adapted to generate the first and second DC currents in responses to the voltage difference between the high potential wire and the low potential wire, and said means for converting the sawtooth wave is adapted to convert the sawtooth wave to a pulse train having a pulse repetition frequency which is proportional to the line voltage.

5. The arrangement as claims in claim 4, characterized in that it comprises means for converting the pulses of the pulse train to pulses of equal width.

6. The arrangement according to claim 1, characterized in that the first voltage corresponds to a higher potential (VREF1) than the potential (V22) of the high potential wire, that the second voltage corresponds to a lower potential (VREF2) than the potential (V23) of the low potential wire, and that said means (15, 16, 19, 24, 25, 28) for converting the sawtooth wave is adapted to convert the sawtooth wave to a pulse train having a fixed pulse repetition frequency, and a mark-space ratio which is proportional to the ratio between the line voltage and the difference between the first and second voltages.

7. The arrangement of claim 1, wherein said first and second DC currents, from said first and second current generators, respectively, remain substantially constant as the capacitor is repeatedly charged and repeatedly discharged.

8. In a subscriber line interface connected to a telephone line having a high potential wire and a low potential wire, a method of generating a signal for determining the line voltage, the method comprising the steps of:

alternately charging a capacitor to a first voltage by way of a first DC current from a first current generator and discharging the capacitor to a second voltage by way of a second DC current from a second current generator to produce a sawtooth wave having an amplitude corresponding to the difference between the first and second voltages, wherein the first and second current generators are separate from said high and low potential wires of the telephone line, and converting the sawtooth wave to a pulse train related to the line voltage relating to said high potential wire and said low potential wire.

9. The method of claim 8, wherein said first and second DC currents, from said first and second current generators, respectively, remain substantially constant as the capacitor is repeatedly charged and repeatedly discharged.

* * * * *